US012637757B2

(12) United States Patent
Coustier et al.

(10) Patent No.: US 12,637,757 B2
(45) Date of Patent: May 26, 2026

(54) METHOD FOR MANUFACTURING AT LEAST ONE PHOTOVOLTAIC CELL USING A PLATE BEARING ON AT LEAST ONE WIRE

(71) Applicant: COMMISSARIAT A L'ENERGIE ATOMIQUE ET AUX ENERGIES ALTERNATIVES, Paris (FR)

(72) Inventors: Fabrice Coustier, Grenoble (FR); Frédéric Jay, Grenoble (FR); Mathieu Tomassini, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 542 days.

(21) Appl. No.: 18/267,901

(22) PCT Filed: Dec. 9, 2021

(86) PCT No.: PCT/FR2021/052255
§ 371 (c)(1),
(2) Date: Jun. 16, 2023

(87) PCT Pub. No.: WO2022/129739
PCT Pub. Date: Jun. 23, 2022

(65) Prior Publication Data
US 2024/0072188 A1 Feb. 29, 2024

(30) Foreign Application Priority Data
Dec. 16, 2020 (FR) ...................................... 20/13368

(51) Int. Cl.
*C23C 14/50* (2006.01)
*H01L 21/687* (2006.01)
(Continued)

(52) U.S. Cl.
CPC ............. *C23C 14/50* (2013.01); *H10F 71/00* (2025.01); *C23C 14/34* (2013.01);
(Continued)

(58) Field of Classification Search
CPC ..... C23C 16/4583; C23C 14/50; C23C 14/34; H01L 21/6875; H01L 21/68735; H10F 71/00
See application file for complete search history.

(56) References Cited

U.S. PATENT DOCUMENTS

| | | | | | |
|---|---|---|---|---|---|
| 2009/0017193 | A1* | 1/2009 | Merz | ..................... | H10F 71/137 |
| | | | | | 118/500 |
| 2009/0042324 | A1* | 2/2009 | Son | ................... | H01L 21/68742 |
| | | | | | 257/E21.521 |

(Continued)

FOREIGN PATENT DOCUMENTS

| | | | | | | |
|---|---|---|---|---|---|---|
| CN | 106811738 | A | * | 6/2017 | .......... | H10F 71/137 |
| CN | 111270222 | A | * | 6/2020 | .......... | H10F 71/129 |

(Continued)

OTHER PUBLICATIONS

Apr. 11, 2022 International Search Report issued in International Patent Application No. PCT/FR2021/052255.

*Primary Examiner* — Alia Sabur
(74) *Attorney, Agent, or Firm* — Oliff PLC

(57) ABSTRACT

A method for manufacturing at least one photovoltaic cell includes the following steps: (a) providing at least one plate, the plate having a first face and a second face opposite the first face; (b) providing a support device; (c) positioning the plate placing the first face of the plate in contact with the support device; (d1) forming a first conductive material on the first face of the plate; (d2) forming a second conductive material on the second face of the plate. At least one of the first and second conductive materials is transparent, the (Continued)

support device includes at least one wire, and, during all or part of step (d1), the first face of the plate bears on the wire.

16 Claims, 10 Drawing Sheets

(51) Int. Cl.
  *H10F 71/00*          (2025.01)
  *C23C 14/34*          (2006.01)
(52) U.S. Cl.
  CPC .... *H01L 21/68735* (2013.01); *H01L 21/6875*
         (2013.01); *H01L 21/68771* (2013.01)

(56)                    References Cited

U.S. PATENT DOCUMENTS

| | | | |
|---|---|---|---|
| 2012/0108002 A1 | 5/2012 | Lee et al. | |
| 2013/0244373 A1* | 9/2013 | Cho | H10F 19/33 |
| | | | 438/98 |
| 2017/0117423 A1 | 4/2017 | Wang | |
| 2018/0347032 A1* | 12/2018 | Matsuzaki | C23C 14/541 |
| 2021/0180186 A1* | 6/2021 | Yoshimura | C23C 16/4583 |

FOREIGN PATENT DOCUMENTS

| | | | | |
|---|---|---|---|---|
| CN | 111979522 A | * | 11/2020 | C23C 14/50 |
| CN | 213583724 U | * | 6/2021 | |
| JP | 2013-184717 A | | 9/2013 | |
| KR | 20040078795 A | | 9/2004 | |
| KR | 101451065 B1 | * | 10/2014 | H01L 21/203 |

* cited by examiner

METHOD FOR MANUFACTURING AT LEAST ONE PHOTOVOLTAIC CELL USING A PLATE BEARING ON AT LEAST ONE WIRE

TECHNICAL FIELD OF THE INVENTION

The technical field of the invention concerns a method for manufacturing at least one photovoltaic cell. As part of this manufacturing method, it is sought to form a first conductive material on a first face of a plate and a second conductive material on a second face of the plate opposite the first face of the plate. Notably, the photovoltaic cell may be based on crystalline silicon and for example of the heterojunction type. For example, the photovoltaic cell may include an amorphous silicon (a-Si)—crystalline silicon (c-Si) hetero-junction.

STATE OF THE ART

It is known, notably in the field of the manufacture of photovoltaic cells, to deposition the same type of material on first and second opposite faces of a plate during a passage of the plate in an equipment of deposition of said material. This material may be a transparent conductive oxide. To carry out this deposition, a support device, also called a transport tray, may be used, intended to pass through the deposition equipment. The transport tray is configured to support and hold plates. To this end, the transport tray includes through holes machined so as to each form a pocket, for a corresponding plate. For example, each through hole includes, to form the corresponding pocket, a shoulder notably delimited by a variation of the section of the through hole in the thickness of the transport tray. The shoulder is then intended to form a bearing surface for a corresponding plate. Each shoulder is such that the bearing surface will come into contact with the periphery of the first face of the corresponding plate, thus the bearing surface adopts the form of a closed loop. Thus, the plates may each be positioned in one of the pockets so that, for each plate:

a peripheral portion of the first face of said plate is in contact with the bearing surface of the corresponding hole, thus providing support of said plate, and another portion of the first face, surrounded by the peripheral portion, of said plate is accessible in the hole, the second face of said plate is fully accessible in the hole.

When the plates are positioned in the holes and supported by the transport tray, the transport tray may pass through the deposition equipment so as to allow the deposition of the material by means of two targets, respectively placed at the top and the bottom of the deposition equipment. The targets may include the transparent conductive oxide such as for example an indium-tin oxide. Thanks to these targets, it is possible to carry out the deposition of the transparent conductive oxide by cathode sputtering which is performed in all directions and therefore covers all the unprotected surfaces of the plates. Thus, for each plate, the deposition is therefore total on the second face of said plate and is partly masked on the first face of said plate by the bearing surface on which said plate rests.

For each hole, the shoulder will, on the one hand, allow supporting the corresponding plate and, on the other hand, serve as a mask in order to ensure an electrical discontinuity between the material deposited on the first face of the corresponding plate and the material deposited on the second face of the corresponding plate, this allowing for example the formation on the corresponding plate of two distinct and opposite electrodes of a corresponding photovoltaic cell.

Such a transport tray has the following disadvantages:

the plates, depending on their size and thickness, may bend when they are each placed in a corresponding pocket, the partial masking of the first faces of the plates by the bearing surfaces during the manufacture of the photovoltaic cells induces an efficiency which is not optimal during the operation of these photovoltaic cells, it is limited to one plate format, so specific transport trays are required so that the bearing surfaces, providing the mechanical support of the sheets, also allow, in the context of the manufacture of photovoltaic cells, a correct masking of the deposition of the transparent conductive oxide over the entire periphery of the first face of each of the plates, depending on the dimensions of the plates, they may bend when they are supported by the transport tray, which may affect the quality of the deposition of the transparent conductive oxide.

For example, taking a width of the bearing surface of 1.2 mm, it is possible that the transport tray may support plates of variable dimensions by taking into account, for example, a variability in dimension of plus or minus 0.25 mm between the plates. Thus, such a width of the bearing surface allows guaranteeing a suitable support of the corresponding plate and obtaining a good electrical insulation between the material deposited on the first face of the corresponding plate and the material deposited on the second face of the corresponding plate. However, taking as an example a photovoltaic cell formed from a square or pseudo-square plate, for example 156 mm on a side, this induces the presence, at the first face, of an inactive surface corresponding to a fraction of the total surface of the first face of the plate after deposition of the transparent conductive oxide because of the use of the bearing surface. Thus, if the photovoltaic cell has a theoretical efficiency, the effective efficiency of the photovoltaic cell is strictly lower than the theoretical efficiency because of this inactive surface not covered with transparent conductive oxide.

Thus, there is a need to improve the support of a plate during the manufacture of a photovoltaic cell, for example to overcome at least one of the disadvantages listed above.

OBJECT OF THE INVENTION

The object of the invention is to improve the way in which at least one plate is supported during a method for manufacturing at least one photovoltaic cell using the plate. This allows, for example, to improve the formation of at least one conductive material on the plate.

To this end, the invention relates to a method for manufacturing at least one photovoltaic cell, the manufacturing method including the following steps:

a) providing at least one plate, said plate including a first face and a second face opposite the first face, b) providing a support device, c) positioning the plate by placing the first face of the plate in contact with the support device, $d_1$) forming a first conductive material on the first face of the plate while the plate is supported by the support device, $d_2$) forming a second conductive material on the second face of the plate while the plate is supported by the support device, the manufacturing method being such that:

at least one of the first and second conductive materials is transparent, the support device includes at least one wire, and during all or part of step $d_1$), the first face of the plate bears on the wire.

The use of the wire, or where appropriate several wires, allows improving the support of the plate during step $d_1$) and step $d_2$) in order notably to improve the formation of the first conductive material and the formation of the second conductive material. According to one embodiment, this improvement of the support allows, for example, to avoid or limit the bending of the plate by means of the wire(s) and, for example, while limiting the masking of the first face of the plate; this allows improving the homogeneity of the first and second conductive materials formed on the plate. According to one embodiment, this improvement of the support may allow, for example by means of several wires, to provide a support of the plate adapted to tend to maximize the surface of the first face of the plate on which the first conductive material is formed in order to improve the efficiency of the photovoltaic cell.

The manufacturing method may also include one or several of the following characteristics:

the support device includes a slot for the plate, the slot including a bearing surface, and, at the end of step c) and throughout step $d_1$), the first face of the plate bears on the bearing surface and on the wire;

at the end of step c), the first face of the plate bears on wires of the support device;

the manufacturing method is such that: the support device includes a first set of wires and a second set of wires; step $d_1$) includes a first period and a second period during which the first conductive material is formed on the first face of the plate; during the first period, the first face of the plate bears on the wires of the first set of wires while the wires of the second set of wires are spaced apart from the plate; during the second period, the plate rests, through the first conductive material formed on the first face of the plate during the first period, on the wires of the second set of wires while the wires of the first set of wires are spaced apart from the plate;

step $d_1$) includes, while the wires support the plate, a relative displacement between the plate and the wires;

the relative displacement is executed by using mechanical or acoustic vibrations;

the manufacturing method is such that: the wire of the support device or each wire of the support device includes a core and a plurality of grains, the grains of the plurality of grains being fastened to the core; and at the end of step c) and throughout step $d_1$), the first face of the plate bears only on grains;

the manufacturing method is such that: at the end of step c), the wires form a mask arranged against the first face of the plate; said mask prevents, when step $d_1$) is executed, the formation of the first conductive material on a portion of the first face of the plate, said portion extending to the periphery of the first face of the plate; and it results from the execution of step $d_1$) and step $d_2$), the presence of a first layer made from the first conductive material and arranged on the first face of the plate, and the presence of a second layer made from the second conductive material and in contact with the second face of the plate, the first and second layers being separate;

before step c), the position of the wires is adjusted according to the dimensions of the plate;

the first conductive material and the second conductive material are each chosen from: a transparent conductive oxide and a metallic material;

the manufacturing method includes a step d) of forming a material on the surface of the plate, this step d) being executed by implementing, for example simultaneously, steps $d_1$) and $d_2$), the first conductive material and the second conductive material corresponding to the same transparent conductive oxide;

it results from steps $d_1$) and $d_2$) the formation of a material on the surface of the plate, and the manufacturing method includes a step e) consisting in delimiting, in the material, a first layer in contact with the first face of the plate and a second layer in contact with the second face of the plate such that the first layer is separate from the second layer, step e) including a step of removing a portion of the material;

the removal step is executed by a grinding wheel or a laser;

the removal of the portion of the material is carried out on a lateral edge of the plate, the lateral edge connecting the first and second faces of the plate;

the manufacturing method is such that: step c) positions a masking element belonging to the support device on a cutting area formed by part of the surface of the first face, the masking element preventing the formation of the first conductive material on the cutting area throughout step $d_1$); and it includes a step of separating the plate into at least two parts, the separation step being executed, after step $d_1$), by cutting through the cutting area;

step a) consists in providing several plates and for each plate: step c) is executed so as to position said plate, step $d_1$) is executed so that the first conductive material is deposited on the first face of said plate, step $d_2$) is executed so that the second conductive material is deposited on the second face of said plate.

The invention also relates to a support device intended to support at least one plate during the formation of a first conductive material and a second conductive material on the plate. The support device includes at least one wire, the wire being arranged so as to participate in the support of the plate.

The support device may also include one or several of the following characteristics:

the support device includes at least one slot for the plate, the slot including a bearing surface, the bearing surface and the wire being arranged to participate both and simultaneously in the support of the plate;

the support device includes several wires;

the support device is such that: the wires are divided into a first set of wires and a second set of wires; it includes a mechanism for positioning the wires configured to vary between a first configuration and a second configuration; in the first configuration, the wires of the first set of wires are positioned in a support area; in the first configuration, the wires of the second set of wires are spaced apart from the support area; in the second configuration, the wires of the second set of wires are positioned in the support area; and in the second configuration, the wires of the first set of wires are spaced apart from the support area;

the support device includes a mechanical or acoustic vibration generator.

Other advantages and characteristics can emerge from the detailed description which follows.

BRIEF DESCRIPTION OF THE DRAWINGS

The invention will be better understood on reading the following detailed description, given solely by way of non-limiting example and made with reference to the accompanying drawings listed below.

6

Figure 7:
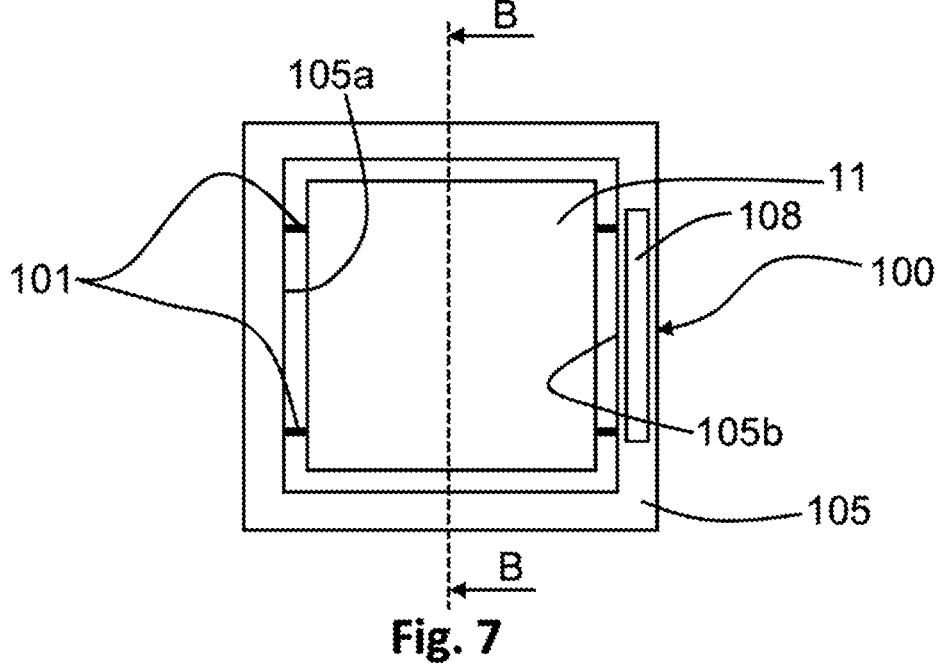
FIG. 7 schematically illustrates, according to another particular embodiment of the invention, a top view of the support device supporting a plate.
Figure 21:
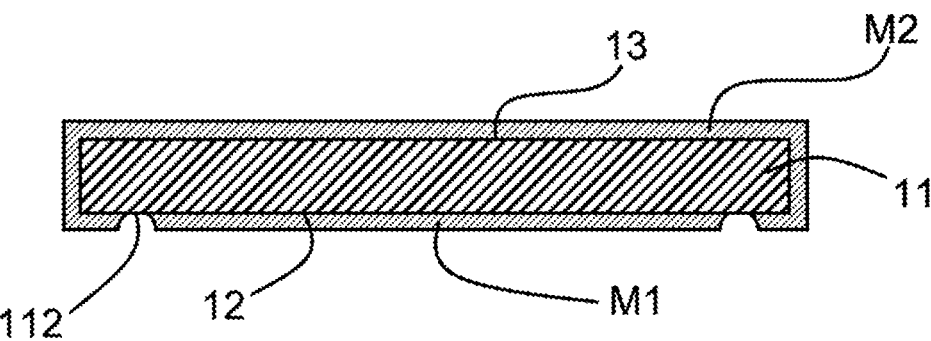

FIG. 21 schematically illustrates, according to a sectional view, the result of steps consisting in forming first and second conductive materials on the plate when the plate is supported according to the embodiment of FIG. 7.

Figure 14:
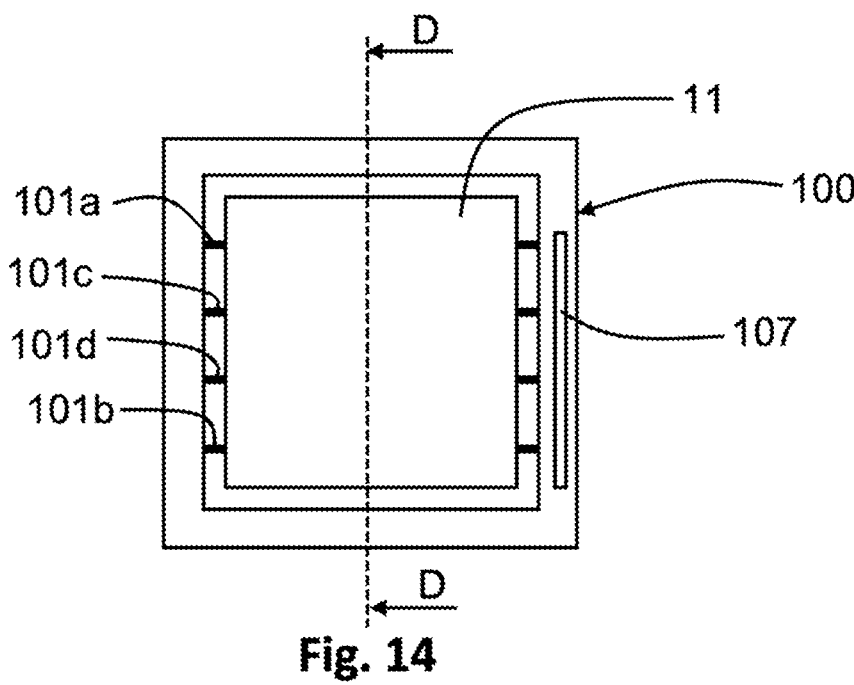
FIG. 14 schematically illustrates, according to a top view, a particular embodiment of the support device supporting a plate, this support device including movable wires.
Figure 15:
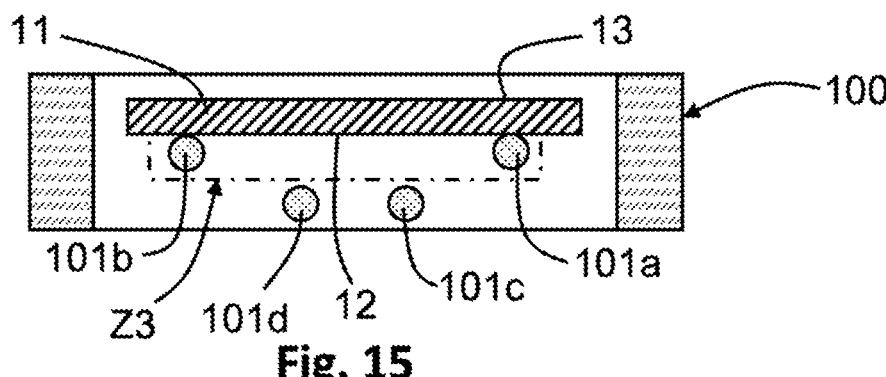
FIG. 15 is a schematic view according to the section D-D of FIG. 14 when a positioning mechanism adopts a first configuration.
Figure 16:
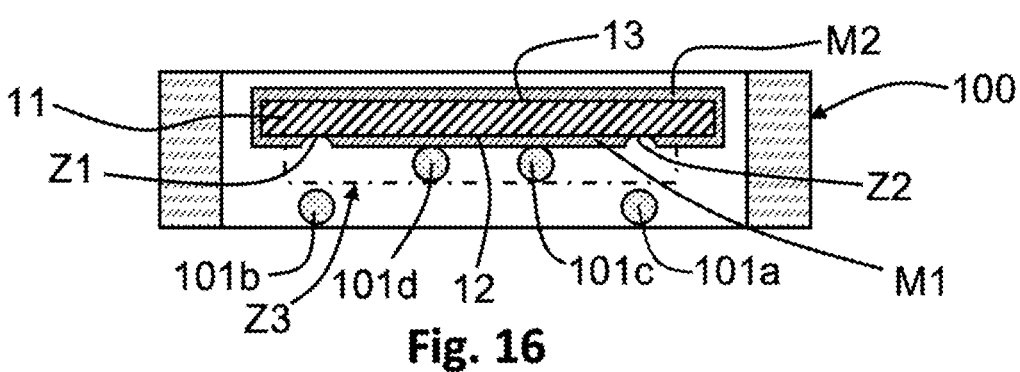
FIG. 16 is a schematic view according to the section D-D of FIG. 14 when the positioning mechanism adopts a second configuration.
Figure 22:
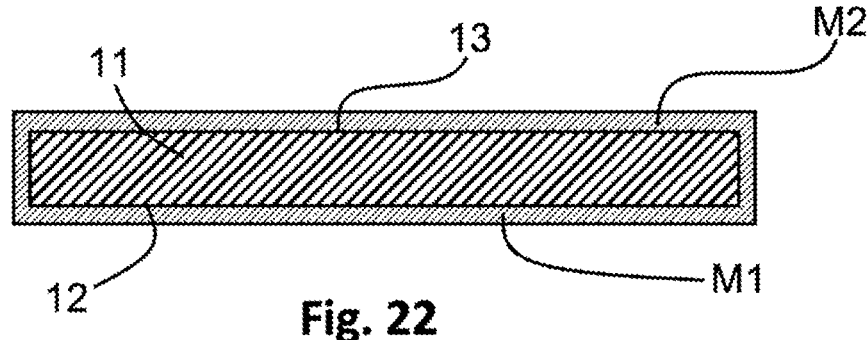

FIG. 22 schematically illustrates, according to a sectional view, the result of a formation of first and second conductive materials on the plate when the plate is supported by the support device according to FIGS. 14 to 16.

Figure 23:
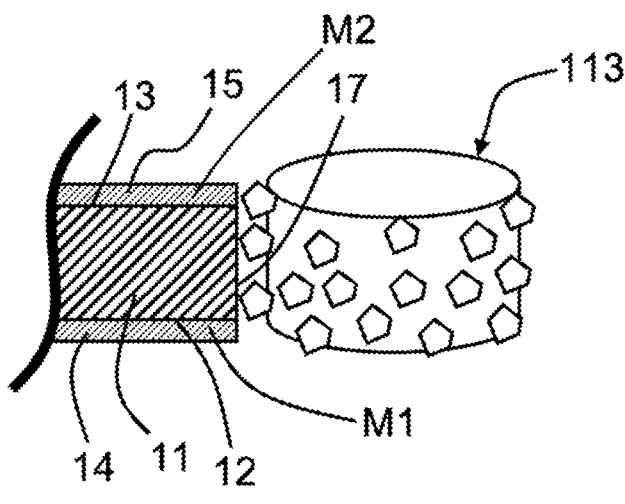

FIG. 23 schematically illustrates, according to a partial sectional view, a step of removing, by means of a grinding wheel, material formed on the plate.

Figure 24:
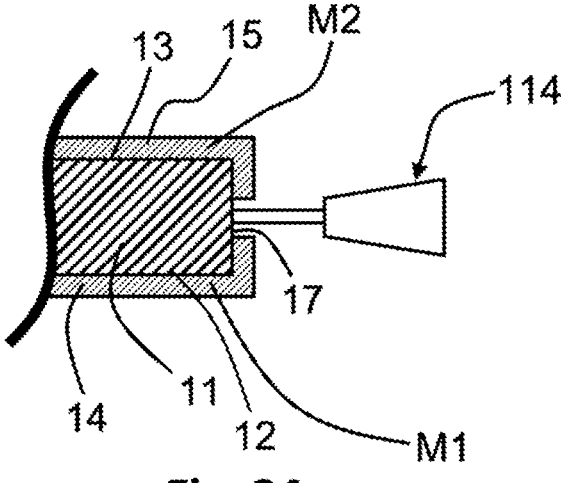
Figure 25:
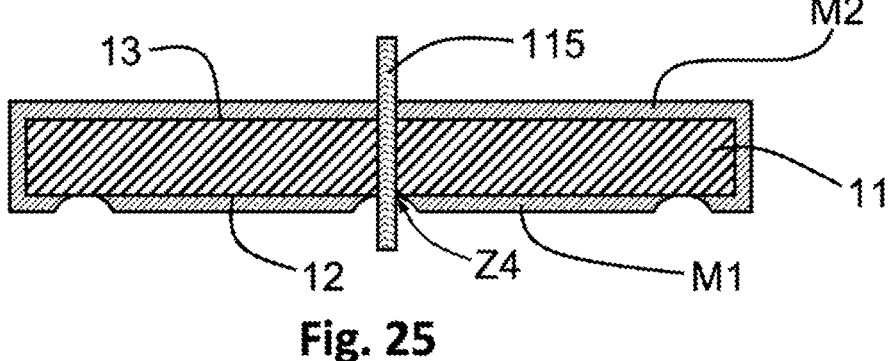

FIG. 24 schematically illustrates, according to a partial sectional view, a step of removing, by means of a laser, material formed on the plate FIG. 25 schematically illustrates, according to a sectional view, a step of separating a plate into two parts to form two photovoltaic cells.

Figure 26:
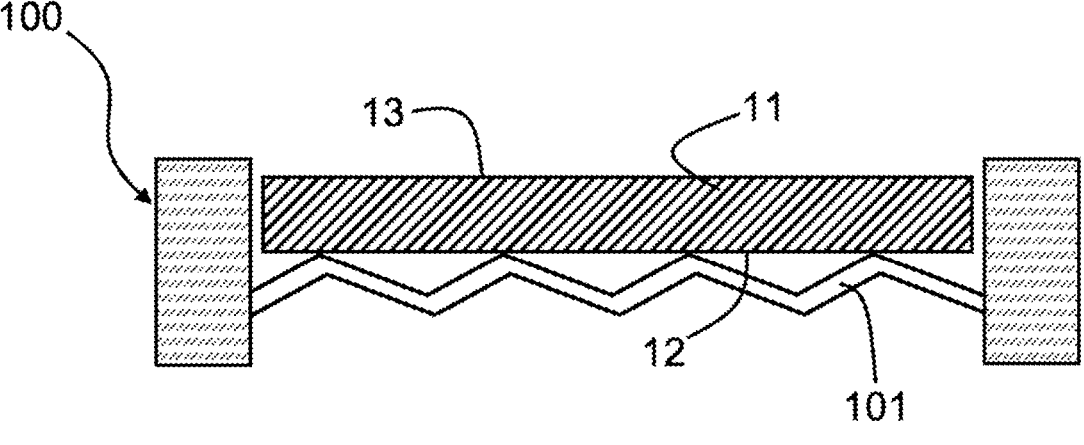

FIG. 26 schematically illustrates, according to a sectional view, the support device, according to a particular embodiment, supporting a plate.

In these figures, the same references are used to designate the same elements. In addition, the various elements are not represented to scale so as to favor the clarity of the figures.

DETAILED DESCRIPTION

In the present description, by "comprised between two values", it is understood that the limits formed by these two values are comprised in the corresponding range.

By "based on" when speaking of an object based on a material, it is understood in the present description that the material is predominant in the composition of the object.

Figure 1:
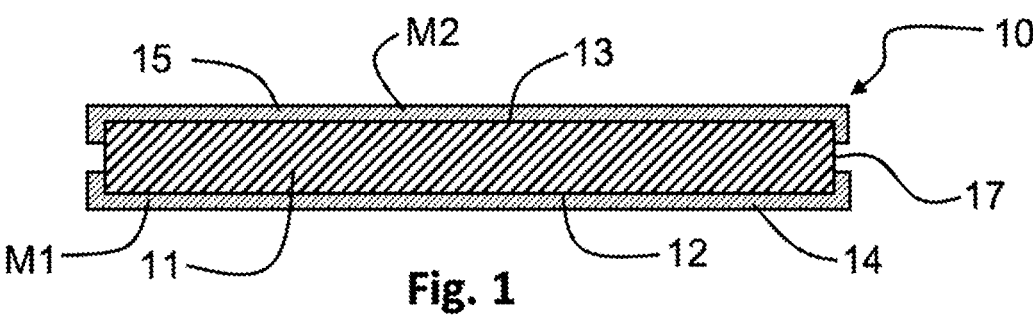
FIG. 1 schematically represents a sectional view of an example of a photovoltaic cell manufactured by a manufacturing method according to one embodiment of the present invention.
Figure 2:
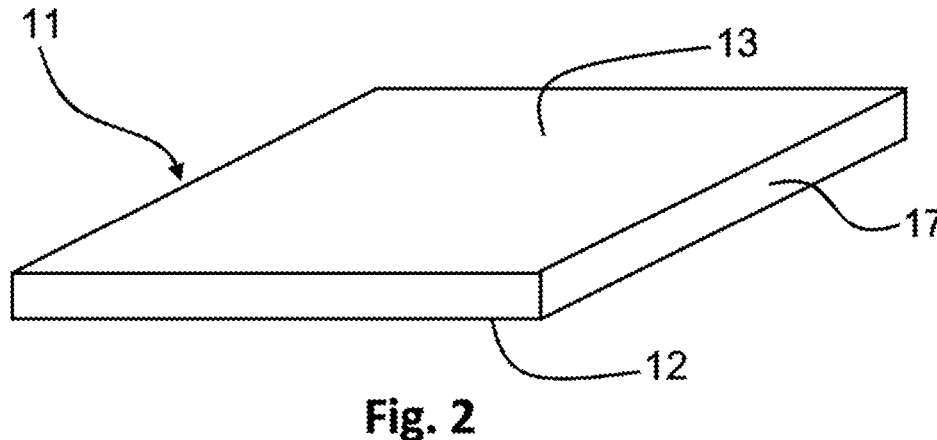
FIG. 2 schematically represents a perspective view of an example of plate used during the manufacturing method.

The present invention falls within the context of the manufacture of at least one photovoltaic cell 10 using at least one plate 11. Notably, everything that applies to the plate 11 may apply to the plates 11 when there are several. An example of the photovoltaic cell 10 of which a part is formed by the plate 11 is illustrated in FIG. 1. Thus, the photovoltaic cell 10 may include the plate 11. The plate 11, as illustrated as an example in FIGS. 1 and 2, includes a first face 12 and a second face 13 opposite the first face 12. Preferably, the photovoltaic cell 10 is such that there is arranged on the first and second faces 12, 13 respectively a first conductive material M1 and a second conductive material M2, for example each obtained by deposition on the plate 11. Notably, the first conductive material M1 is arranged so that a first layer 14 made of this first conductive material M1 is in contact with the first face 12. Notably, the second conductive material M2 is arranged so that a second layer 15 made of this second conductive material M2 is in contact with the second face 13. Preferably, the second face 13 is covered by the second layer 15. Preferably, the first face 12 is covered by the first layer 14 or is partially covered by the first layer 14. Alternatively to this example of photovoltaic cell 10, the plate 11 may be cut, after undergoing technological steps for example microelectronics and including notably the formation of the first conductive material M1 and the second conductive material M2, to form several photovoltaic cells.

By "conductive" in the present description, it is understood electrically conductive.

By "manufacturing of at least one photovoltaic cell 10", it is understood that the manufacturing method may be implemented so as to manufacture several photovoltaic cells 10 at the same time. Everything that applies to a plate 11 to form one or several photovoltaic cells 10 may apply to plates 11 each forming a part of one of the photovoltaic cells 10, or to plates 11 each to be cut to form several photovoltaic cells 10.

The plate 11 may be a wafer which will have been functionalized for example so as to form a heterojunction for photovoltaic cell(s). In this sense, the plate 11 can be based on crystalline silicon and in particular be of the heterojunction type, for example an amorphous silicon (a-Si)—crystalline silicon (c-Si) heterojunction.

For example, the plate 11 may have been obtained by conventional microelectronics methods starting from a doped crystalline silicon substrate including opposite faces. On one of these opposite faces of the crystalline silicon substrate, a p-n junction is formed; and, on the other of these opposite faces of the crystalline silicon substrate, an n-n or p-p junction is formed depending on the doping of the crystalline silicon.

The method for manufacturing said at least one photovoltaic cell 10 includes the following steps:

a) providing said at least one plate 11, forming for example a part of the photovoltaic cell 10 to be manufactured, this part incorporating a heterojunction, b) providing a support device 100 also called a transport tray, for example FIGS. 3 to 12, 14 to 16 and 18 show examples of the support device 100, the support device 100 being configured to support the plate 11, c) positioning the plate 11 by placing the first face 12 of the plate 11 in contact with the support device 100, which results in that the plate 11 is supported by the support device 100, d₁) forming the first conductive material M1, by example by deposition, on the first face 12 of the plate 11 while the plate 11 is supported by the support device 100, d₂) forming the second conductive material M2, for example by deposition, on the second face 13 of the plate 11 while the plate 11 is supported by the support device 100.

Of course, steps d₁) and d₂) are executed after step c) and for example one after the other or simultaneously. The support device 100, provided in step a), includes at least one wire 101 (for example visible in FIGS. 3, 6, 7, 8, 9, 10, 11, 12, 13, 17, 18, 19, 20). During all or part (that is to say during at least part) of step d₁), the first face 12 of the plate 11 bears on the wire 101. Furthermore, during all or part of the step d₂), the first face 12 of the plate 11 may bear on the wire 101. The manufacturing method allows implementing a support by means of the wire 101, which has the advantage of improving the support of the plate 11 from which there results an improvement during the formation of the first and second conductive materials M1, M2 respectively on the first and second faces 12, 13.

By "bear on", it is understood that a contact is established between a first element, such as the first face 12 of the plate 11, and a second element, such as the wire(s) 101 on which the first element bears. The bearing force exerted by the first element on the second element may be the result of gravity.

Everything that applies to the wire 101 in the present description may apply to each wire 101 when the support device 100 comprises several.

The wire 101 may be smooth and, for example, it does not include anything other than the wire 101 which may then be made up of one or several strands. The smooth wire 101 is devoid of the grains mentioned below and notably does not exhibit any deformation along its length. The wire 101 may in this case have a diameter comprised between 10 μm and 350 μm and preferably between 20 μm and 100 μm. The wire 101 may be metallic, for example steel.

Figure 17:
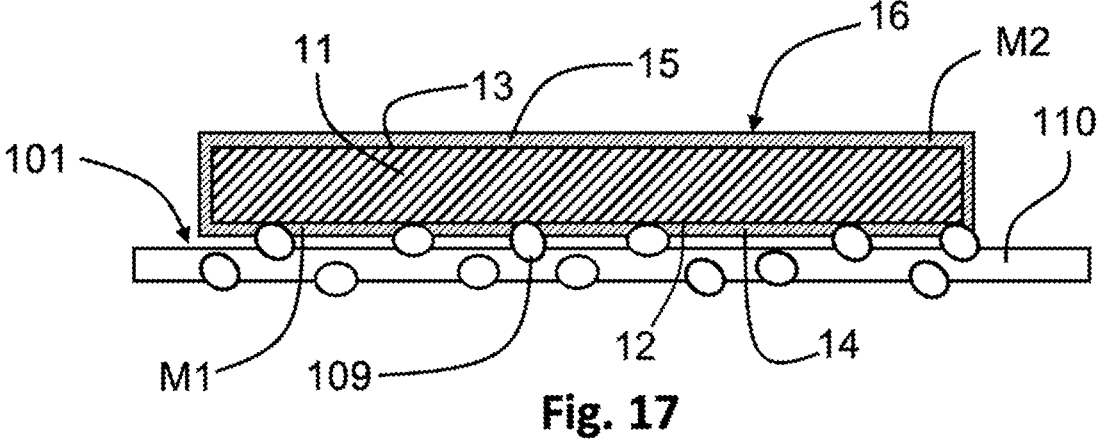
FIG. 17 schematically represents, according to a sectional view, the result of the formation of first and second conductive materials on the surface of the plate while the plate is supported by a grain wire.

The wire 101 may include a core 110, also called support wire, and grains 109 linked to this core 110 (see for example FIG. 17). The core 110 may in this case have a diameter comprised between 10 μm and 350 μm and preferably between 20 μm and 100 μm. The grains 109 may have a size that can range up to 100 μm and notably the size of each grain 109 may be comprised between 10 μm and 20 μm. The core 110 may be made up of one or several strands. The core 110 may be metallic, for example steel. Such a wire 101 may be a diamond wire.

Step d₁) and/or step d₂) may be such that the formations of the first conductive material M1 and the second conductive material M2 are produced by deposition. Thus, step d₁) may consist in depositing the first conductive material M1 for example by physical vapor deposition, also known by the acronym PVD corresponding to "physical vapor deposition"; the same goes for the second material M2 which may be deposited by PVD (step d₂)).

Notably, the photovoltaic cell 10 includes a front face and a rear face opposite the front face. The front face of the photovoltaic cell 10 is by definition the face intended to be oriented notably to receive the incident radiation to be captured by the photovoltaic cell 10. The rear face is a face not directly illuminated by the light radiation that the photovoltaic cell 10 must capture.

At least one of the first and second conductive materials M1, M2 is transparent. This transparency is defined notably with respect to the radiation, notably incident radiation, to be captured by the photovoltaic cell 10 to generate electrical energy. This radiation is the solar radiation. Notably, the transparency is defined as the ability to pass the spectral range of the solar radiation useful for the operation of the photovoltaic cell 10.

This transparency of said at least one of the first and second conductive materials M1, M2, is dictated by the fact that one of the first and second faces 12, 13 of the plate 11 will be considered to be on the side (this is that is to say the closest in comparison to the other of the first and second faces 12, 13) of the front face of the photovoltaic cell 10. The front face of the photovoltaic cell 10 being intended to be oriented to receive the incident radiation, it must therefore be ensured that the material (M1 or M2) formed on the side of this front face is transparent to allow the radiation to pass.

The first face 12 of the plate 11 is preferably the one which will be on the side of the rear face of the photovoltaic cell 10 (the second face 13 is then farther from the rear face of the photovoltaic cell 10 than is the first face 12) and in this case the first conductive material M1 may or may not be transparent. In fact, the preferential support of the plate 11 via the first face 12 which will be on the side of the rear face of the photovoltaic cell 10 is dictated by the fact that possibly uncovered places of the first face 12 due to the support of the plate 11 will be reflective to the radiation to be captured by the photovoltaic cell 10, notably if these places are made of silicon or include silicon: it is better that the front face of the photovoltaic cell 10 does not have any parts that reflect the radiation to be captured by the photovoltaic cell 10.

The first and second materials M1, M2 are conductive since they are notably each intended to form all or part of a corresponding electrode of the photovoltaic cell 10.

The first and second conductive materials M1, M2 may be identical or different, when they are identical they may be formed, for example at the same time or not, by a step d) forming a material (constituting the first and second materials M1, M2) on the surface of the plate 11. Thus, the manufacturing method may include the step d) of forming the material on the surface of the plate 11, this step d) being executed by the implementation, for example simultaneous or not, of steps d$_1$) and d$_2$), the first conductive material M1 and the second conductive material M2 corresponding to the same transparent conductive oxide. This allows for example to deposition the first and second conductive materials M1, M2 using the same support device 100, and where appropriate at the same time if the steps d$_1$) and d$_2$) are simultaneous.

While of course respecting the fact that one of the first and second conductive materials M1, M2 is transparent, each of the first and second conductive materials M1, M2 may be chosen from: a transparent conductive oxide also known by the acronym TCO for "transparent conductive oxide" and a metallic material, one of the properties of the metallic material is that it is not transparent. For example, the TCO may be an indium-tin oxide, also called indium oxide doped with tin, and known by the acronym ITO corresponding to "indium-tin oxide". For example, the metallic material may be silver or aluminum. Such materials are particularly suitable for forming the first and second conductive materials M1, M2.

For example, the TCO may be used in the context of the production of a transparent electrode to make the connection with the amorphous silicon of the plate 11 and a metallization grid of the transparent electrode arranged on the side of the front face of the photovoltaic cell 10.

Figure 3:
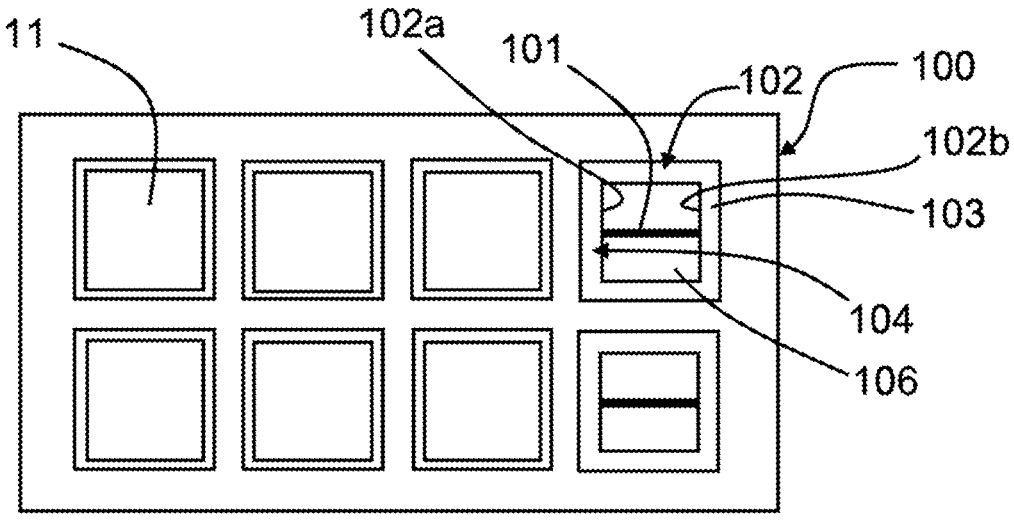
FIG. 3 schematically represents a top view of an example of a support device used during the manufacturing method.
Figure 4:
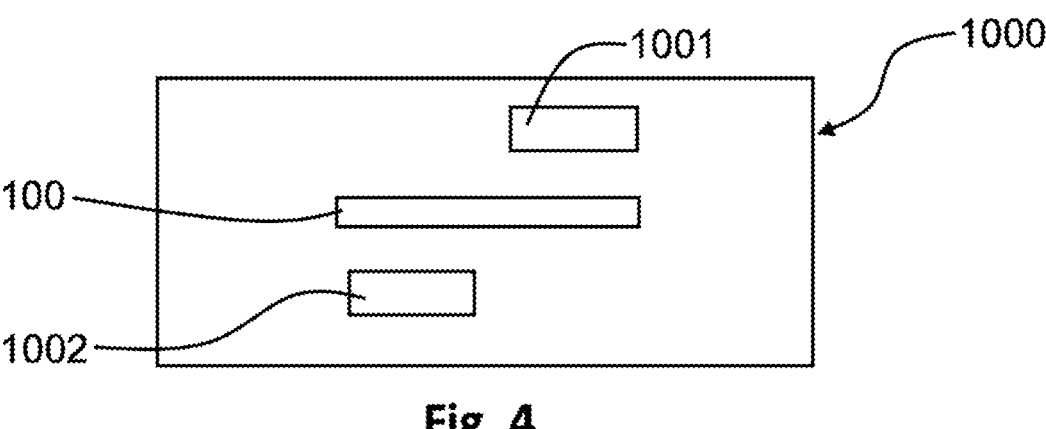
FIG. 4 represents, according to one embodiment of the manufacturing method and schematically, a step consisting in forming a conductive material on one or several plates by cathode sputtering.

For example, step d$_1$) is implemented by deposition of the first conductive material M1 and may include a step of passing the support device 100, supporting the plate 11 or several plates 11, for example as represented in FIG. 3, 5 to 12, 14 to 16 or 18, in a deposition equipment 1000, also called deposition chamber and of which a particular example is shown in FIG. 4. By "passing the support device 100 in the deposition equipment 1000", it is understood that the support device 100 passes through the deposition equipment 1000. It follows that at the end of the passage step, the first conductive material M1 has been deposited on the plate(s) 11.

For example, step d$_2$) is implemented by depositing the second conductive material M2 and may include a step of passing the support device 100, supporting the plate 11 or several plates 11, in a deposition equipment 1000 (which may be identical to or distinct from that used for the deposition of the first conductive material M1). It follows that at the end of the passage step, the second conductive material M2 has been deposited on the plate(s) 11.

As mentioned, steps d$_1$) and d$_2$) may correspond to the same step d), notably of depositing, implemented by the same step of passing the support device 100, supporting the plate 11 or several plates 11 in the deposition equipment 1000. In this case, the first material M1 and the second material M2 are identical.

The deposition equipment 1000 is preferably an equipment allowing carrying out a physical vapor deposition by sputtering at least one target. The target(s) 1001, 1002 may each be, where appropriate, made of TCO such as ITO or of a metallic compound such as silver or aluminum depending on the first conductive material M1 to be deposited and/or the second conductive material M2 to be deposited. For example, to implement step d), targets 1001, 1002 are respectively placed at the top and the bottom of the equipment 1000 but not facing each other in the reference frame of FIG. 4 in order to carry out a material deposition in all directions to cover the unprotected surfaces of the plate(s) 11 supported by the support device 100.

Although a so-called "pass-through" deposition equipment 1000 has been described above, steps d$_1$) and d$_2$) may also be implemented by means of one or several equipment allowing a so-called "stationary" deposition, that is to say without requiring the support device 100 to pass through the equipment 1000 concerned.

Of course, the invention also relates to the support device 100 intended to support said at least one plate 11 during the formation of the first conductive material M1 and of the second conductive material M2 on the plate 11. In particular, the support device 100 is configured to support plate 11 notably while making accessible the second face 13 and the first face 12 with a view to forming the first and second conductive materials M1, M2 therein. In other words, the support device 100 is configured to allow forming the first and second conductive materials M1, M2 respectively on the first face 12 of the plate 11 and on the second face 13 of the plate 11 when it is supported, notably via its first face 12, by means of the wire 101. Therefore, the support device 100 includes said at least one wire 101, the wire 101 being arranged so as to participate in the support of the plate 11, in particular when the first face 12 of the plate 11 bears on the wire 101. Such a support has the advantage of limiting the contact area between the wire 101 and the plate 11, resulting for example in masking caused by the wire 101 limited to the dimensions of the wire 101 on the second face 12 of the plate 11 when this second face 12 bears on the wire 101.

Figure 5:
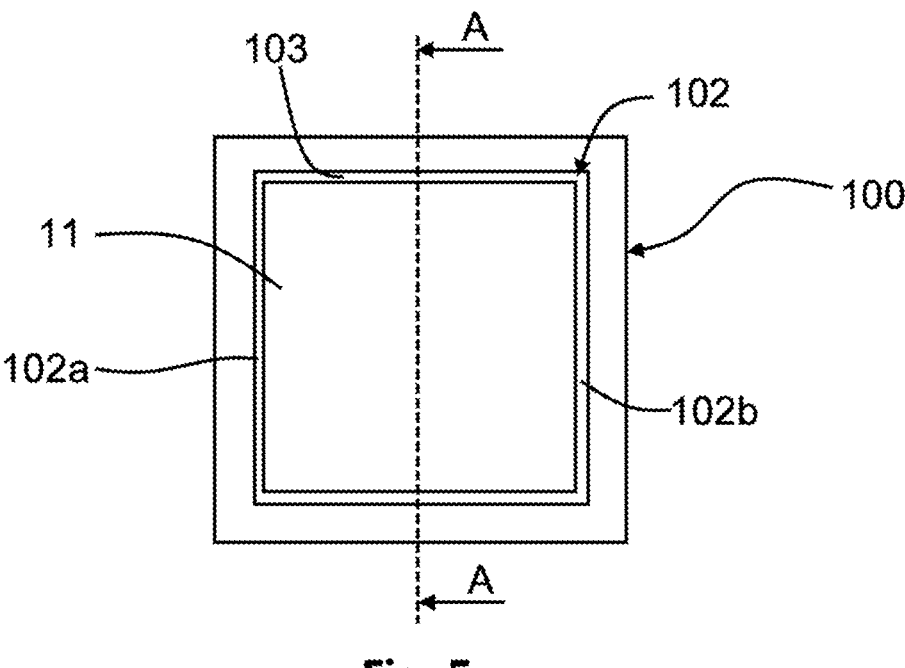
FIG. 5 schematically illustrates, according to one particular embodiment of the invention, a top view of the support device supporting a plate.
Figure 6:
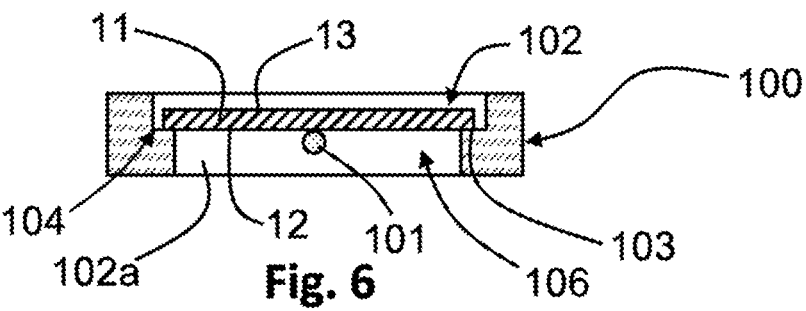
FIG. 6 is a schematic view according to the section A-A of FIG. 5.

According to one embodiment, for example as illustrated in FIGS. 3, 5 and 6, the support device 100 includes at least one slot 102 for the plate 11. The slot 102 includes a bearing surface 103, the bearing surface 103 and the wire 101 being notably arranged to participate both and simultaneously in the support of the plate 11. For example, the slot 102 is a pocket allowing the plate 11 to be housed; this pocket may be formed in an opening 106 and be delimited by a shoulder 104. Thus, the wire 101 may be arranged across the slot 102 and notably the opening 106 so as to connect two opposite parts 102$a$, 102$b$ of the slot 102 and in particular of the shoulder 104. The wire 101 may be arranged across the slot 102 in its center, that is to say equidistant between two opposite portions of the bearing surface 103. The combination of a bearing surface 103 and the wire 101 with a view to supporting the plate 11 has the advantage of maintaining the rigidity of the plate 11, notably during step d$_1$) and during step d$_2$). By opening 106, it is understood that the opening 106 passes through the support device 100, this opening 106 is therefore a through opening and may be considered as a through hole. In particular, depending on the size and the thinness of the plate 11, such a slot 102 allows, by means of the wire 101, to limit or avoid the bending of the plate 11 when it is supported by the support device 100; this is reflected in the context of the manufacturing method by:

obtaining a better homogeneity of the first and second conductive materials M1, M2 formed/deposited on the plate 11 in terms of thickness for each of the first and second layers 14, 15, and in terms of electrical properties for each of the first and second layers 14, 15, obtaining a better homogeneity in terms of optical properties for said at least one of the first and second conductive materials M1, M2 which is transparent. According to this embodiment, at the end of step c) and throughout step d$_1$), as well as notably throughout step d$_2$), the plate 11 (and more precisely the first face 12 of the plate 11) is preferably bearing on the bearing surface 103 and on the wire 101, this allowing to limit or avoid the bending of the plate 11 during the execution of step $d_1$) and, where appropriate, during the execution of step $d_2$). In particular, the support device 100 is here configured to hold the wire 101 taut, for example by mechanical fastening and using at least one spring to ensure a predetermined tension of the wire 101, thus ensuring a suitable support of the plate 11. Several wires 101, notably held taut, may be used to further improve the support of the plate 11: in this case, when the plate 11 is supported by the support device 100, it then bears on these wires 101, notably throughout step $d_1$) and step $d_2$) and at the end of step c).

Of course, the support device 100 may include several slots 102 as described, as for example visible in FIG. 3, in order to allow the first and second conductive materials M1, M2 to be formed on several plates 11 at the same time.

The support device 100 may include several wires 101. In this case, at the end of step c), the first face 12 of the plate 11 bears on wires 101 of the support device 100, this results notably in that the first face 12 of the plate 11 bears on wires 101 during all or part of step $d_1$) and notably during all or part of step $d_2$). This has the advantage of ensuring a good support of the plate 11 while globally limiting the surface masked by these wires 101 from which results an optimization of the surface of the first face 12 of the plate 11 covered by the first conductive material M1 at the end of step $d_1$). Another advantage of using wires 101 is that the plate 11 may be supported only by these wires 101, from which it results that the support device 100 may receive different plate formats: the same support device 100 may be used to allow the formation of the first and second conductive materials M1, M2 on plates 11 of different dimensions, whether during the same manufacturing method or during different implementations of the manufacturing method (during a first implementation the support device 100 may be used with a first plate format, then during a subsequent implementation the support device 100 may be used with a second plate format different from the first format). Preferably, the support device 100 is configured to hold these wires 101 taut, for example using clamping means and possibly springs, to allow a suitable support of the plate 11.

Figure 8:
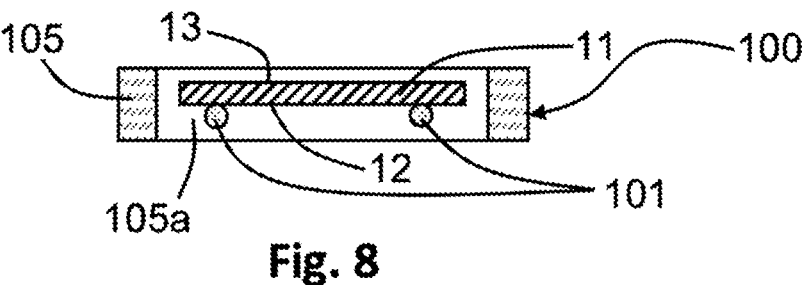
FIG. 8 is a schematic view according to the section B-B of FIG. 7.

According to one embodiment, as illustrated for example in FIGS. 7 and 8, the support device 100 may have two wires 101 arranged to support the same plate 11. In this embodiment, the plate 11 is preferably in contact only with the wires 101 at the end of step c) and in particular throughout step $d_1$), this having the advantage of limiting the masking of the first face 12 during the execution of step $d_1$). In this case, the support device 100 may include a frame 105, the frame 105 including two opposite edges 105a, 105b connected by the wires 101 which are then tensioned between these two edges 105a, 105b. The wires 101 may be mechanically attached to the frame 105, for example by tightening screws, and be tensioned, for example by means of springs.

Figure 9:
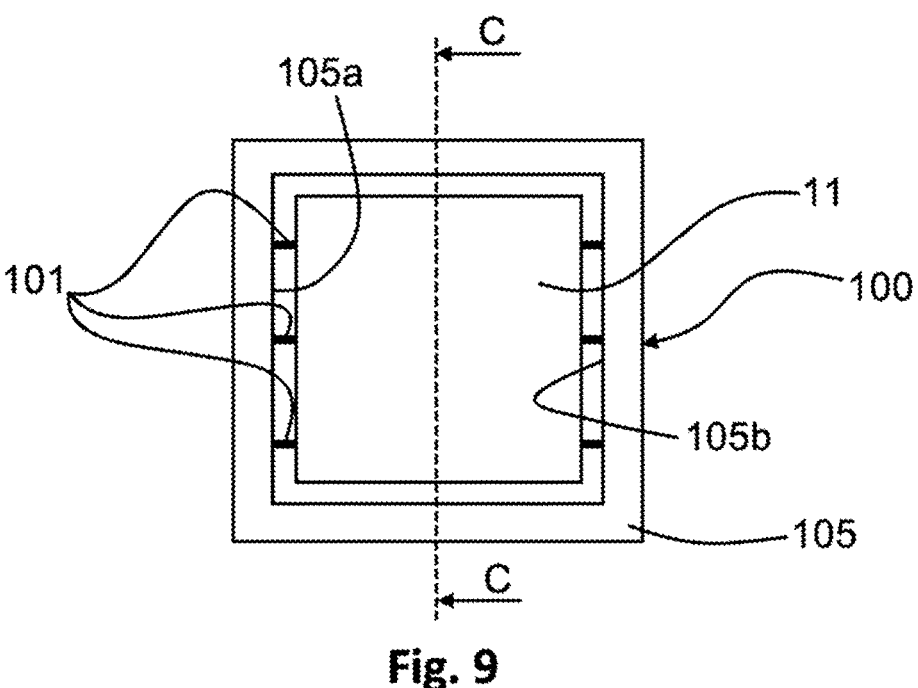
FIG. 9 schematically illustrates an improvement of the support device of FIG. 7, this improvement allowing notably to support a large plate and/or to avoid the bending of the plate.
Figure 10:
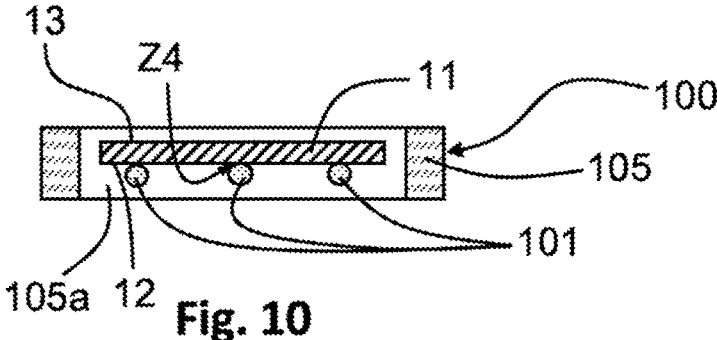
FIG. 10 is a schematic view according to the section C-C of FIG. 9.

According to an improvement, for example as seen in FIGS. 9 and 10, the support device 100 may include at least three wires 101 arranged to support the same plate 11; these three wires 101 connecting for example the two opposite edges 105a, 105b of the frame 105. This has the advantage of maintaining the rigidity of the plate 11, notably during step $d_1$) and, where appropriate, during step $d_2$). In particular, depending on the size and the fineness of the plate 11, these three wires 101 allow to limit or avoid the bending of the plate 11 when it is supported by the support device 100, this resulting in as part of the manufacturing method by:

obtaining a better homogeneity of the first and second conductive materials M1, M2 formed/deposited on the plate 11 in terms of thickness for each of the first and second layers 14, 15, and in terms of electrical properties for each of the first and second layers 14, 15, obtaining a better homogeneity in terms of optical properties for said at least one of the first and second conductive materials M1, M2 which is transparent. The number of wires 101 may here be adapted depending on the size and the thickness of the plate 11. Although in FIGS. 9 and 10 only one plate 11 is shown, the support device 100 may be adapted to carry several plates 11 simultaneously, these plates 11 being able to be supported by the same three wires 11 or each by a triplet of wires 101 which is specific to it.

Figure 11:
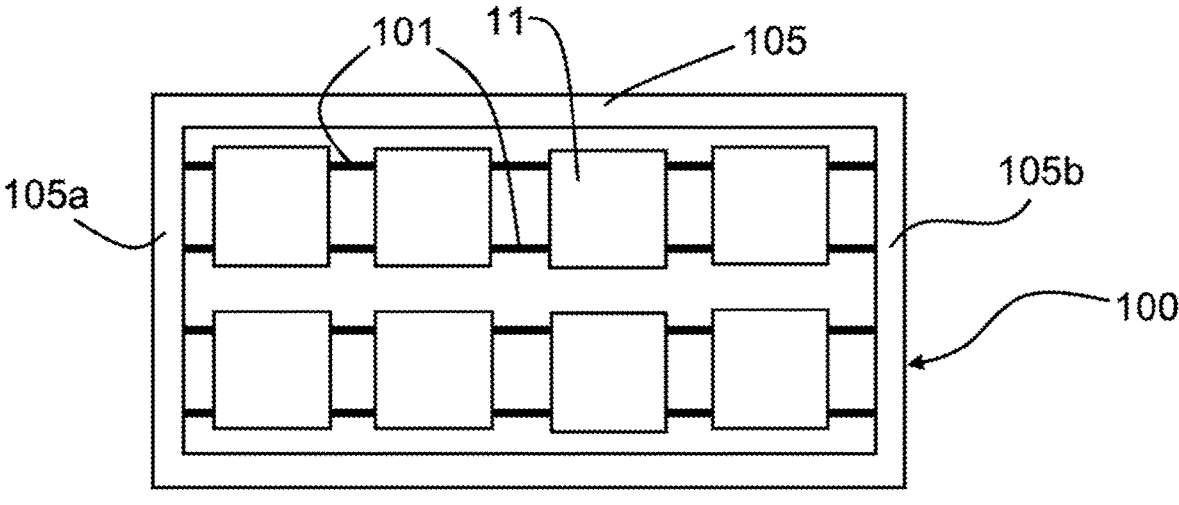
FIG. 11 represents, according to a top view, a particular and schematic embodiment of the support device allowing supporting several plates at the same time.
Figure 12:
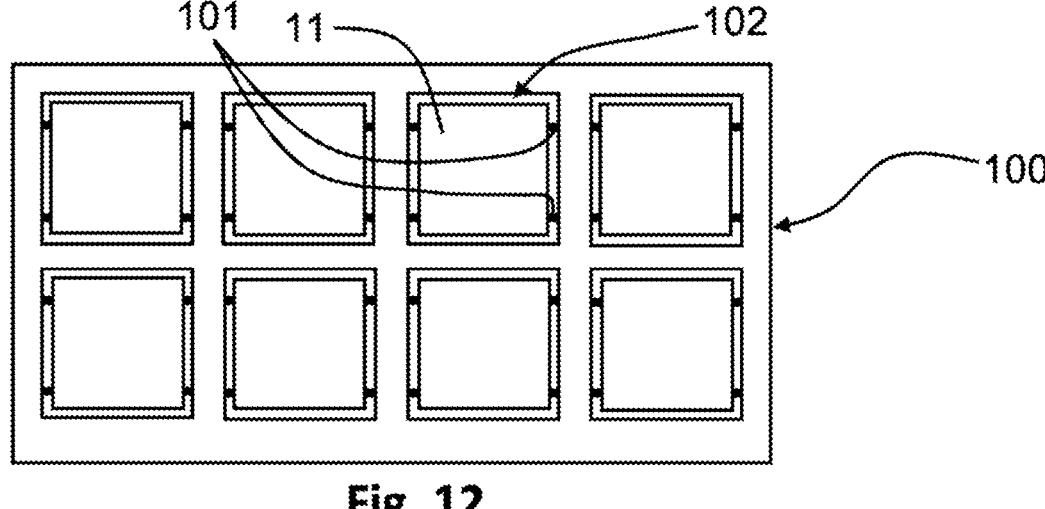
FIG. 12 represents, according to a schematic top view, another particular embodiment of the support device allowing supporting several plates at the same time.

On the principle of the realization with two wires 101 supporting the plate 11, it is possible that the support device 100 can support several plates 11 as shown by way of examples in FIGS. 11 and 12. According to a first case (FIG. 11) the support device 100 includes the frame 105 whose two edges 105a, 105b are connected by two tensioned wires 101 to support several plates 11 simultaneously. In FIG. 11, two rows of plates 11 are shown by way of example (each row including four plates 11 in the example illustrated), the plates 11 of each row of plates 11 being supported only by wires 11 (for example two in number) connecting, while being tensioned, the two edges 105a, 105b. According to this first case, the plates 11 are supported only by wires 101 notably at the end of the execution of steps c) each allowing to position one of the plates 11 via its first face 12 in contact with the support device 100. According to a second case, for example illustrated in FIG. 12, the support device 100 includes slots 102 each allowing to receive a plate 11, each slot 102 being formed by an opening passing through the support device 100, the openings are therefore through openings. According to this second case, steps c) each allow to position one of the plates 11 via its first face 12 in contact with the support device 100. Each slot 102 may be of the type of the pocket described above. Each slot 102 incudes tensioned wires 101, for example two in number. For example, the tensioned wires are between two opposite edges of the corresponding opening so that each plate 11 may be positioned, by the corresponding step c), at the slot 102 which corresponds to it so as not to be in contact only with wires 101 at the end of its positioning.

Figure 13:
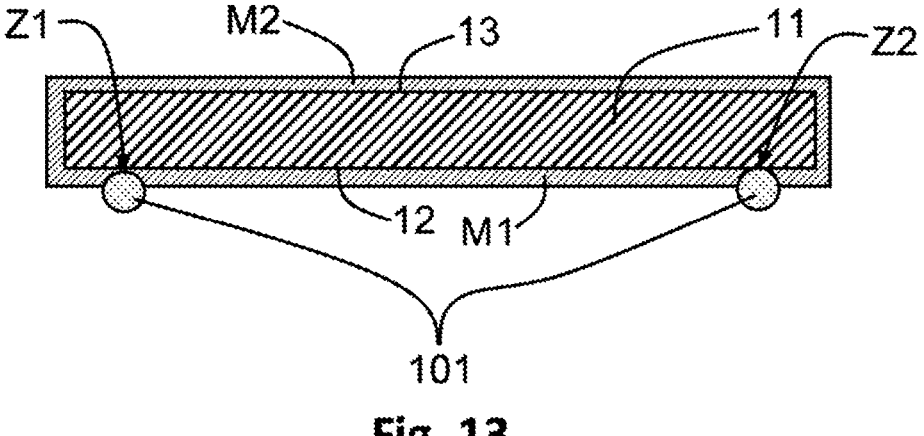
FIG. 13 schematically represents, according to a sectional view, the result of the formation of first and second conductive materials on the surface of the plate while the plate is supported by two wires.

FIG. 13 allows to illustrate by way of example a result of steps $d_1$) and $d_2$) when several wires 101 are used to support the plate 11 throughout step $d_1$) and throughout step $d_2$): these wires 101 then form masks which prevent the formation of the first conductive material M1 in areas Z1, Z2 of contact between the wires 101 and the plate 11. By choosing suitable wires 101, when the plate 11 is supported only by these wires 101, this allows to limit the masking of the first face 12 of the plate 11, notably with respect to the solution where the plate 11 is in contact with the bearing surface 103 during step $d_1$). Thus, the use of very fine wires 101, for example with a diameter comprised between 10 μm and 350 μm and preferably with a diameter comprised between 20 μm and 100 μm, may allow the deposition of the first conductive material M1 over almost the entire surface of the first face 12 of the plate 11 outside areas Z1 and Z2.

Even with the use of wires 101 to support the plate 11, there is a need to further improve the result of step $d_1$) by seeking to optimize the formation of the first conductive material M1, for example by allowing the first conductive material M1 to cover the entire first face 12 of the plate 11. Indeed, if the used wires 101 are smooth, it is possible that in contact with each wire 101 and the plate lithe deposition of the first conductive material M1 is incomplete and/or discontinuous. For example, for a wire 101 of 40 μm in diameter, it is possible that a masked/shaded area of a few microns on the first face is not covered by the first conductive material M1 over the entire length of the contact between the wire 101 and the plate 11.

In order to avoid the masking mentioned above, several technical solutions may be envisaged:

first solution: the plate(s) 11 rest on more than two wires 101 during step $d_1$) by alternating the bearings of each plate 11 on different sets of wires; for example, for each plate 11, the masking obtained during the use of two first wires on which the first face 12 bears may then be covered when the first wires are spaced apart from the plate 11 and a support of the plate 11 is ensured by two second wires then in contact with the first conductive material M1 deposited when the first face 12 of the plate 11 bears on the first wires, second solution: it is implemented a displacement of the plate or plates 11 relative to the surface of the wires supporting the plate(s) 11 concerned (for example via a displacement of the wires, via a displacement of the plate(s), via the use of ultrasonic or mechanical vibrations).

In general, the first solution, an embodiment of which is illustrated in FIGS. 14 to 16, may be implemented as follows. The support device 100 includes a first set of wires and a second set of wires. Step $d_1$) includes a first period and a second period during which the first conductive material M1 is formed on the first face 12 of the plate 11. During the first period, the first face 12 of the plate 11 bears on the wires 101a, 101b of the first set of wires while the wires 101c, 101d of the second set of wires are spaced apart from the plate 11 (FIG. 15).

During the second period, the plate 11 rests, through the first conductive material M1 formed on its first face 12 during the first period, on the wires 101c, 101d of the second set of wires while the wires 101a, 101b of the first set of wires are spaced apart from the plate 11 (FIG. 16).

This has the advantage of allowing the formation of the first conductive material M1 in the areas Z1 and Z2 not covered by the first conductive material M1 at the end of the first period which results in the obtaining of a plate 11 whose first face 12 is covered by the first conductive material M1 as shown for example in FIG. 22. This allows, if the first and second materials M1, M2 are identical, to form (step d)) a single layer of the same material so to completely cover the plate 11 as shown in FIGS. 14 to 16 and 22.

In FIGS. 15 and 16, there is shown the wire 101a, 101b, 101c, 101d which are parallel to each other during the first period and during the second period. Of course, other possibilities may be considered, for example:

the wires 101a, 101b of the first set of wires may be arranged so as to be in contact, during the first period, with first and second corners of the plate 11 opposite along a diagonal of the plate 11, and the wires 101c, 101d of the second set of wires may be arranged so as to support the plate 11 through the first conductive material M1, during the second period, at opposite third and fourth corners of the plate 11 along a diagonal of the plate 11, these third and fourth corners being distinct from the first and second corners.

In the context of the first solution and to allow its effective implementation, the wires 101a, 101b, 101c, 101d being divided into a first set of wires and a second set of wires, the support device 100 may include a mechanism 107 (visible in FIG. 14) for positioning the wires 101 configured to vary between a first configuration and a second configuration. In the first configuration, the wires 101a, 101b of the first set of wires are positioned in a support area Z3 (FIG. 15). In the first configuration, the wires 101c, 101d of the second set of wires are spaced apart from the support area Z3 (FIG. 15). In the second configuration, the wires 101c, 101d of the second set of wires are positioned in the support area Z3 (FIG. 16). In the second configuration, the wires 101a, 101b of the first set of wires are spaced apart from the support area Z3 (FIG. 16). The support area Z3 is shown in dotted lines in FIGS. 15 and 16. For example, the mechanism 107 may include eccentric parts mounted to rotate and each configured to displace two wires 101 arranged at different places on the eccentric part, this would then allow, by rotation of the eccentric parts, holding the plate 11 at different places.

In general, the second solution may be effectively implemented as follows: step $d_1$) includes, while the wires 101 support the plate 11, a relative displacement between the plate 11 and the wires 101. The relative displacement may for example correspond to displacing the plate by acting on the plate 11 or to displacing the wires 101. This relative displacement may be achieved effectively by transmitting, where appropriate, to the plate 11 or to the wires 101 mechanical vibrations, or else by subjecting the plate 11 or the wires 101 to an acoustic wave such as ultrasound to generate the desired relative displacement. In other words, the relative displacement may be executed by using mechanical or acoustic vibrations, for example applied to the plate 11 or to the wires 101 supporting the plate 11. In particular the acoustic vibrations are ultrasonic. Thus, a vibration, for example mechanical or acoustic, generator 108 (visible for example in FIG. 7) may be used to ensure the relative displacement. Such a vibration generator 108 may be integrated into, or separate from, the support device 100. For example, the vibration generator 108 may include a vibratory source coupled to a sonotrode on which the support device 100 rests to allow a displacement of the plate(s) during step $d_1$).

The first and second solutions, although ideal in the sense that they make it possible to completely cover the first face 12 of the plate 11, involve implementing displacements of wires or plates, which may be costly to implement. In this sense, it may be advantageous to simply limit the shading of the wires 101 caused by the contact of these wires 101 with the first face 12 of the plate 11. One solution is that the plate(s) 11 may bear on wires 101 allowing the formation of the first conductive material M1 without continuous shadowing. For this, the plate(s) 11 may, for example, bear on wires 101 with grains 109 such as diamond wires throughout step $d_1$). The diamond wires may include in the range of one hundred diamonds per millimeter. In this case, the wires 101 may have a core 110 with a diameter comprised between 20 μm and 100 μm and supporting grains 109 whose size may be comprised between 10 μm and 20 μm; this allows to limit the shading during the implementation of step $d_1$). Points of contact between the wires 101 and the plates 11 are then present only at the places where there are grains 109. Step $d_1$) may then be carried out by forming the first conductive material M1 on the surface of the first face 12 of the plate 11 or of each of the plates 11 except at the contact points. This solution with wires 101 with grains 109 may also apply when the wire 101, for example when it is unique, is in contact with the plate 11 as for example in the context of the embodiment of FIGS. 5 and 6.

Thus, in general, the solution with wires 101 including grains 109 may be implemented by the fact that the or each wire 101 of the support device 100, in contact with the plate 11 at the end of step c), includes a core 110 and a plurality of grains 109 fastened to the core 110 (see for example FIG. 17) for example as described above. At the end of step c) and throughout step $d_1$), the plate 11 bears only on grains 109 for example of the wire 101 or several wires 101. This allows that for the or each plate 11, during the execution of step $d_1$), the first conductive material M1 will be able to be formed on the second face 12 of the plate 11 excluding the point contacts of the grains 109 with the second face 12 of the plate 11. Thus, in this case the first conductive material M1 is deposited/formed between the core 110 of the or each wire 101 and the second face 12 of the plate 11 supported by the wire(s) 101. It results that steps $d_1$) and $d_2$) may be executed so as to form a single layer 16 of the same material mostly covering the plate 11 so as to locally delimit the first layer 14 of the first conductive material M1 and the second layer 15 of the second conductive material M2 (with the first and second materials M1, M2 which are identical and consist of the material).

Figure 18:
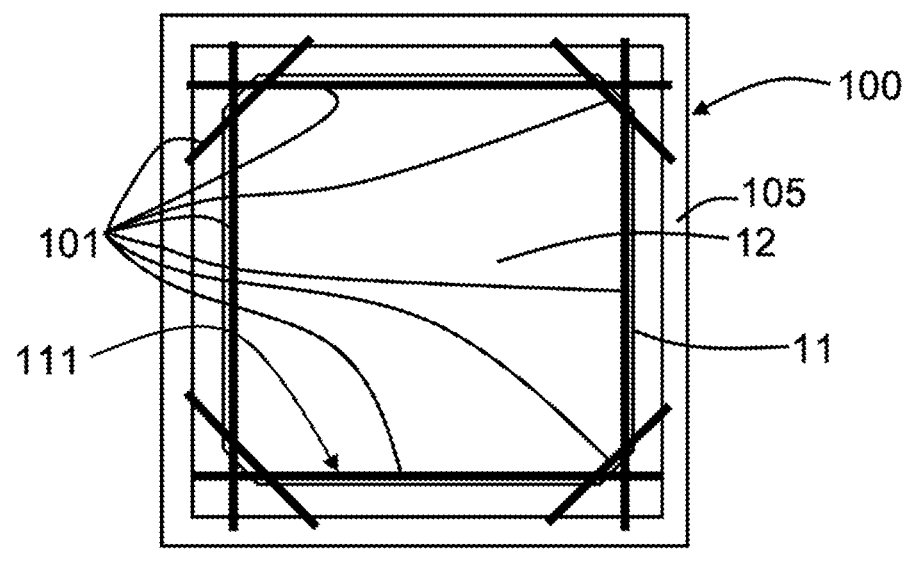
FIG. 18 schematically represents an embodiment in which the plate is supported by a wire mask.
Figure 19:
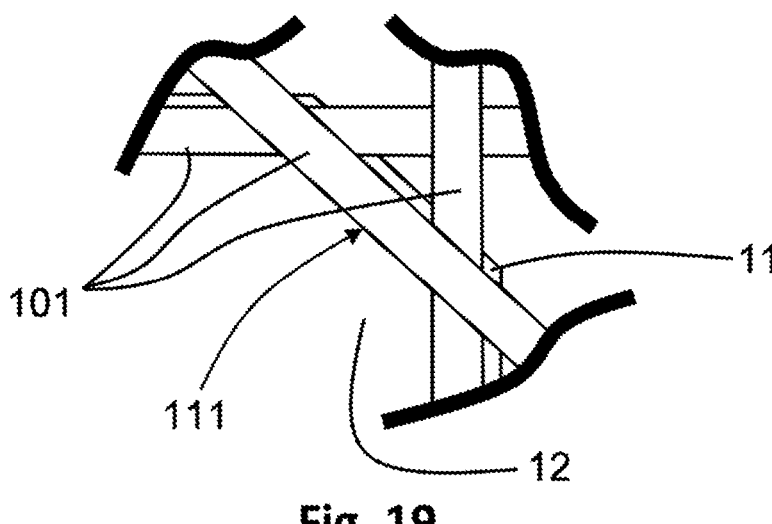
FIG. 19 is a detailed view of part of FIG. 18.
Figure 20:
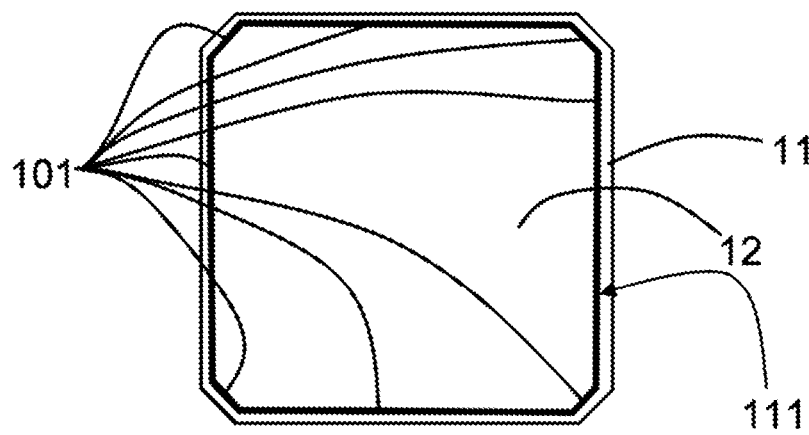
FIG. 20 schematically shows another embodiment in which the plate is supported by a wire mask.

In some cases, although it is sought to optimize the surface of the second face 12 covered by the first conductive material M1 at the end of step $d_1$), it is also sought to isolate, notably electrically, the first conductive material M1 deposited on the first face 12 with respect to the second conductive material M2 deposited on the second face 13, for example to form two separate electrodes. Therefore, to allow obtaining the insulation sought directly at the end of steps $d_1$) and $d_2$), it is possible to use a mask 111, examples of which are illustrated in FIGS. 18 to 20, opposing the formation of the first conductive material M1 on a portion 112 (FIG. 21) of the first face 12 of the plate 11.

In general, to form the desired mask 111, the advantage of which is to allow to form/delimit two separate layers, the manufacturing method may be such that at the end of step c), the wires 101 form the mask 111 arranged against the first face 12 of the plate 11. This mask 111 prevents, when step $d_1$) is executed, the formation of the first conductive material M1 on the portion 112 (visible for example in FIG. 21) of the first face 12 of the plate 11, said portion 112 extending to the periphery of the first face 12. In this case, it results from the execution of steps $d_1$) and $d_2$):

the presence of the first layer 14 made from the first conductive material M1 and arranged on the first face 12, and the presence of the second layer 15 made from the second conductive material M2 and in contact with the second face 13 of the plate 11, the first and second layers 14, 15 being separate.

In other words, at the end of step $d_1$), the portion 112 is in the form of a closed loop. This closed loop is arranged along the periphery of the first face 12 and this closed loop is not covered by the first conductive material M1 formed during step $d_1$). Of course, to obtain the portion 112 at the periphery of the first face 12 of the plate 11, the mask 111 remains in contact with the first face 12 of the plate 11 throughout step $d_1$) and notably throughout step $d_2$).

The wires 101 used to form the mask 111 may here be chosen so that their section, or diameter, is adapted to ensure the presence of the portion 112 not covered by the first conductive material M1 at the end of step $d_1$). The diameter of the wires 101 may in this case be comprised between 180 μm and 350 μm. In this case, the use of smooth wires is recommended in order to ensure that the plate 11 is in contact with the wires 101 to allow the presence of the portion 112.

For example, the wires 101 forming the mask 111 are held taut, in particular by the frame 105. Notably, these wires 101 are tensioned one above the other and are for example simply in contact (that is to say without mechanical connection other than contacts) so as to form the mask 111. In FIG. 18, the wires 101 are eight in number because the plate 11 includes chamfered corners but this number may be adapted depending on the shape of the plate 11. FIG. 19 illustrates in particular a corner of the plate 11 to show an example of arrangement of the wires 11 at this corner.

For example, the wires 101 forming the mask 111 are welded as shown in particular in FIG. 20 including eight welded wires 101. This has the advantage of delimiting the mask 111 so that the latter forms a flat frame on which the plate 11 may rest, the masking of the portion 112 of the second face 12 is then better than in the frame of the FIG. 18 where the first conductive material M1 could for example be deposited on the plate 11 at places where the wires overlap.

Depending on whether the mask 111 has wires simply in contact with each other or welded together, the nature of the wires 101 (that is to say their composition), the rigidity of the wires 101, the ability of the wires 101 to be welded will be adapted.

In general, the position of the wires 101, notably before step c), may be adjusted depending on the dimensions of the plate 11, this allowing the support device 100 to adapt and not to be limited to a particular format of plate 11. This may apply as long as the plate 11 is supported by several wires 101 and for example in the case of the presence of the mask 111 when the wires 101 are not welded.

The possibility of using the mask 111 to obtain and isolate the first and second layers 14, 15 from each other has been mentioned previously. In case the mask 111 is not used, there is a need to find a solution to obtain electrical separation of the first and second layers 14, 15. For this, the manufacturing method may be such that steps $d_1$) and $d_2$) result in the formation of a material on the surface of the plate 11. This material, also called covering material, may be formed from a single material so that the first and second conductive materials M1, M2 may for example be TCO. Thus, the manufacturing method may include a step e) consisting in delimiting, in the material, the first layer 14 in contact with the first face 12 of the plate 11 and the second layer 15 in contact with the second face 13 of the plate 11 such that the first layer 14 is separated from the second layer 15 (FIGS. 23 and 24). This step e) includes a step of removing a portion of the material. Step e) is preferably implemented when steps $d_1$) and $d_2$) consist of a step d) of forming the same transparent conductive material (that is to say the material mentioned above) on the all or most of the surface of the plate 11 (FIG. 22).

The removal step may be executed by a grinding wheel 113 or a laser 114 as shown for example in FIGS. 23 and 24 respectively. The grinding wheel 113 and the laser 114 are each particularly suitable for removing the portion of the material in order to delimit the first and second layers 14, 15.

The removal of the portion of the material is preferably carried out on a lateral edge 17 of the plate 11, the lateral edge 17 (for example visible in FIGS. 2, 23, 24) connecting the first and second faces 12, 13 of the plate 11. The lateral edge 17 may have several sides interconnected in the sense that it forms a lateral contour of the plate 11. This allows to retain the covering of the first and second faces 12, 13 of the plate 11 by the material so as not to limit the effective efficiency of the photovoltaic cell 10.

It is possible that the plate 11 is, after step $d_1$), cut, for example to form photovoltaic cells 10. For this, step c) may position a masking element, such as the wire 101 or one of the wires 101 (FIG. 10), on a cutting area Z4 formed by part of the surface of the first face 12. The masking element, belonging to the support device 100, prevents the formation of the first conductive material M1 on the cutting area Z4 throughout step $d_1$). The manufacturing method may then include, for example as illustrated in FIG. 25, a step of separating the plate 11 into at least two parts, the separation step being executed after step $d_1$) and notably after step $d_2$), by cutting through the cutting area Z4 (in FIG. 25 the first and second conductive materials M1, M2 are represented notably after step $d_1$) and step $d_2$) having used the support device 100 of FIGS. 9 and 10). This is preferred because it allows, for example, to avoid the diffusion of species for example from the first conductive material M1 in the plate 11, notably it allows to avoid the diffusion of metallic species in the silicon of the plate 11, and in particular if the cutting is done by thermal means such as laser cutting or other. The cutting may also be done for example by means of a saw 115.

In the embodiments where the use of one or several wires 101 with grains 109 such as diamond wires has been mentioned, a wire 101 or wires 101 structured as is for example may be used as an alternative illustrated in FIG. 26 which shows in section the support of the plate 11 by a support device 100 with structured wire(s) 101, that is to say having a zigzag shape to form local points of support of the plate 11 in the manner of the grains 109 so as to allow the formation of the first conductive material M1 during step $d_1$) on as much as possible of the surface of the first face 12 of the plate 11 excluding the points of contact between the wire(s) 101 and the plate 11. For example, the zigzag shape is such that the or each wire 101 includes a succession of segments, and any pair of consecutive segments is such that the segments of this pair are formed respectively in secant and notably orthogonal planes, these planes being also secant to the plane of the plate 11 so as to form local bearing points between the wire 101 and the plate 11 throughout step $d_1$).

Of course, to accelerate the production rates of the photovoltaic cells 10, step a) may consist in providing several plates 11, and for each plate 11:

step c) is executed so as to position said plate 11, step $d_1$) is executed so that the first conductive material M1 is deposited on the first face 12 of said plate 11 notably then supported by means of at least one corresponding wire 101, step $d_2$) is executed so that the second conductive material M2 is deposited on the second face 13 of said plate 11.

In particular, the deposition of the first conductive material M1 and of the second conductive material M2 may be carried out simultaneously by depositing the same material.

The present invention finds an industrial application in the manufacture of silicon-based photovoltaic cells; and notably the silicon-based and heterojunction photovoltaic cells.

In particular, when the wires 101 are used to support the plate 11 alone, this allows to reduce, or even eliminate depending on the embodiment, the loss of photovoltaic efficiency of the photovoltaic cell due to a peripheral masking of the TCO deposit caused by a bearing surface of a shoulder.

Ideally, the support device 100 and/or the wire(s) 101 may have, at least on the surface, a suitable material, also called a neutral material, to avoid the problems of contamination of the plate 11 during the formation of the first and second conductive materials M1, M2. For example, if the first conductive material M1 and the second conductive material M2 are identical, then the surface of the support device 100 may also be formed of the first conductive material M1, such as for example ITO.

The invention claimed is:

1. A method for manufacturing at least one photovoltaic cell, the manufacturing method including the following steps:

a) providing at least one plate, the plate including a first face and a second face opposite the first face, b) providing a support device, c) positioning the plate by placing the first face of the plate in contact with the support device, $d_1$) forming a first conductive material on the first face of the plate while the plate is supported by the support device, $d_2$) forming a second conductive material on the second face of the plate while the plate is supported by the support device, wherein:

at least one of the first and second conductive materials is transparent, the support device includes at least one wire, and during all or part of step $d_1$), the first face of the plate bears on the wire.

2. The manufacturing method according to claim 1, wherein the support device includes a slot for the plate, the slot including a bearing surface, and wherein, at the end of step c) and throughout step $d_1$), the first face of the plate bears on the bearing surface and on the wire.

3. The manufacturing method according to claim 1, wherein, at the end of step c), the first face of the plate bears on wires of the support device.

4. The manufacturing method according to claim 3, wherein:

the support device includes a first set of wires and a second set of wires, step $d_1$) includes a first period and a second period during which the first conductive material is formed on the first face of the plate, during the first period, the first face of the plate bears on the wires of the first set of wires while the wires of the second set of wires are spaced apart from the plate, during the second period, the plate rests, through the first conductive material formed on the first face of the plate during the first period, on the wires of the second set of wires while the wires of the first set of wires are spaced apart from the plate.

5. The manufacturing method according to claim 3, wherein step $d_1$) includes, while the wires support the plate, a relative displacement between the plate and the wires.

6. The manufacturing method according to claim 5, wherein the relative displacement is executed by using mechanical or acoustic vibrations.

7. The manufacturing method according to claim 1, wherein:

the wire of the support device or each wire of the support device includes a core and a plurality of grains, the grains of the plurality of grains being fastened on the core, and at the end of step c) and throughout step $d_1$), the first face of the plate bears only on grains.

8. The manufacturing method according to claim 3, wherein:

at the end of step c), the wires form a mask arranged against the first of the plate, the mask prevents, when step $d_1$) is executed, the formation of the first conductive material on a portion of the first face of the plate, the portion extending to the periphery of the first face of the plate, and it results from the execution of step $d_1$) and step $d_2$), the presence of a first layer made from the first conductive material and arranged on the first face of the plate, and the presence of a second layer made from the second conductive material and in contact with the second face of the plate, the first and second layers being separate.

9. The manufacturing method according to claim 3, wherein before step c), the position of the wires is adjusted depending on the dimensions of the plate.

10. The manufacturing method according to claim 1, wherein the first conductive material and the second conductive material are each chosen from: a transparent conductive oxide and a metallic material.

11. The manufacturing method according to claim 1, wherein it includes a step d) of forming a material on the surface of the plate, this step d) being executed by the implementation, for example simultaneous, of steps $d_1$) and $d_2$), the first conductive material and the second conductive material corresponding to the same transparent conductive oxide.

12. The manufacturing method according to claim 1, wherein it results from steps $d_1$) and $d_2$) the formation of a material on the surface of the plate, wherein it includes a step e) consisting in delimiting, in the material, a first layer in contact with the first face of the plate and a second layer in contact with the second face of the plate in such a way that the first layer is separate from the second layer, step e) including a step of removing a portion of the material.

13. The manufacturing method according to claim 12, wherein the removal step is executed by a grinding wheel or a laser.

14. The manufacturing method according to claim 12, wherein the removal of the portion of the material is carried out on a lateral edge of the plate, the lateral edge connecting the first and second faces of the plate.

15. The manufacturing method according to claim 1, wherein:

step c) positions a masking element belonging to the support device on a cutting area formed by a part of the surface of the first face, the masking element preventing the formation of the first conductive material on the cutting area throughout step $d_1$), and it includes a step of separating the plate into at least two parts, the separation step being executed, after step $d_1$), by cutting through the cutting area.

16. The manufacturing method according to claim 1, wherein step a) consists in providing several plates and wherein for each plate:

step c) is executed so as to position the plate, step $d_1$) is executed so that the first conductive material is deposited on the first face of the plate, step $d_2$) is executed so that the second conductive material is deposited on the second face of the plate.

\* \* \* \* \*